United States Patent
Guillot et al.

(10) Patent No.: US 8,284,534 B2
(45) Date of Patent: Oct. 9, 2012

(54) OVERCURRENT PROTECTION CIRCUIT, INTEGRATED CIRCUIT, APPARATUS AND COMPUTER PROGRAM PRODUCT

(75) Inventors: Laurent Guillot, Seysses (FR); Philippe Dupuy, Toulouse (FR); Jeff Reiter, Dearborn, MI (US)

(73) Assignee: Freescale Semiconductor, Inc., Austin, TX (US)

( * ) Notice: Subject to any disclaimer, the term of this patent is extended or adjusted under 35 U.S.C. 154(b) by 341 days.

(21) Appl. No.: 12/739,084

(22) PCT Filed: Oct. 30, 2007

(86) PCT No.: PCT/IB2007/004452
§ 371 (c)(1),
(2), (4) Date: Apr. 21, 2010

(87) PCT Pub. No.: WO2009/056903
PCT Pub. Date: May 7, 2009

(65) Prior Publication Data
US 2011/0267728 A1   Nov. 3, 2011

(51) Int. Cl.
*H02H 3/08* (2006.01)
*H02H 9/02* (2006.01)
(52) U.S. Cl. ........................ 361/93.1; 361/93.7
(58) Field of Classification Search ............. 361/93.1, 361/93.7
See application file for complete search history.

(56) References Cited

U.S. PATENT DOCUMENTS

| | | | |
|---|---|---|---|
| 6,356,423 B1 | 3/2002 | Hastings et al. | |
| 6,587,027 B1 | 7/2003 | Nadd | |
| 7,064,949 B2 | 6/2006 | Chagny et al. | |
| 7,079,368 B2 * | 7/2006 | Ishikawa et al. | 361/93.1 |
| 7,499,252 B2 * | 3/2009 | Raimondi et al. | 361/93.1 |
| 7,813,094 B1 * | 10/2010 | Sherwin | 361/93.1 |
| 7,948,729 B2 * | 5/2011 | Zhang et al. | 361/93.9 |
| 2002/0080544 A1 | 6/2002 | Pellegrino | |
| 2002/0118500 A1 * | 8/2002 | Covi et al. | 361/93.1 |
| 2003/0072120 A1 | 4/2003 | Ishikawa et al. | |
| 2005/0135037 A1 | 6/2005 | Thiery et al. | |

FOREIGN PATENT DOCUMENTS
WO   2007/074837 A   7/2007

OTHER PUBLICATIONS

International Search Report and Written Opinion correlating to PCT/IB2007/004452 dated Jul. 22, 2008.

\* cited by examiner

*Primary Examiner* — Dharti Patel

(57) ABSTRACT

An over-current protection circuit, including a current input for receiving a input current and a current output electrically connectable to a load, for outputting an output current proportional to the input current. A switch connects the current input to the current output. The switch has at least two switch states including an open state in which a current flow from the current input to the current output is interrupted and a closed state in which the current flow is enabled. The switch includes a switch control input for controlling the switch state. The circuit has a sensor for sensing a load current applied to the load and a controller connected to the sensor for controlling the switch to be in the open state when the sensed load current has exceeded a current threshold during a predetermined period of time, the predetermined period of time being dependent on an amount with which said sensed load current exceeds the threshold.

20 Claims, 3 Drawing Sheets

OVERCURRENT PROTECTION CIRCUIT, INTEGRATED CIRCUIT, APPARATUS AND COMPUTER PROGRAM PRODUCT

FIELD OF THE INVENTION

This invention relates to an overcurrent protection circuit, to an integrated circuit, to an apparatus and to a computer program product.

BACKGROUND OF THE INVENTION

In electronics and electrical engineering fuses, short for 'fusible link', are used to protect a device and wire-harnesses against an excess current. Typically, the fuse has a metal wire or strip which connects the fuse contacts, The wire or strip melts when too much current flows. When the metal strip melts, the electrical connection between the fuse contacts breaks, and hence the fuse breaks the circuit of which the fuse is a part. Thereby, the device is protected from an excessive current.

However, a general disadvantage of a fuse is that it cannot be integrated in an integrated circuit. Furthermore, when the connection is broken the fuse has to be replaced with a new fuse, which is particularly cumbersome in case the fuse is in a position that cannot be accessed easily, as is typically the case in automotive vehicles, such as cars.

Unites States Patent Application Publication US 2005/0135037 describes an electronic fuse comprising an integrated circuit having a control output terminal coupled to a control electrode of a power semiconductor switching device. The power semiconductor switching device is coupled in series with a load between first and second potentials. The integrated circuit further comprises a current sense input for sensing the current through the power semiconductor switching device, and a driver circuit for driving the power semiconductor switching device, which is coupled to a current limiting circuit responsive to the sensed current in the power semiconductor switching device. The current limiting circuit controls the driver circuit such that if the current through the power semiconductor switching device exceeds a predetermined threshold, the current limiting circuit generates a command to pulse the power semiconductor switching device on and off in a period of pulsed operation to maintain the average current in the power semiconductor switching device below a predetermined level. The electronic fuse further comprises a first timer circuit for limiting the period of pulsed operation to a pre-programmed first duration and further for controlling the power semiconductor switching device whereby the power semiconductor switching device is turned off when two commands to pulse the power semiconductor switching device are generated by the current limiting circuit within a duration less than a predetermined second duration.

However, a disadvantage of the electronic fuse disclosed in the above identified US patent application Publication is that the behavior thereof does not correspond to the behavior of a conventional fuse. Furthermore, the pulsing on and off modifies the current. Furthermore, the electronic fuse known from this prior art document consumes a relatively high amount of power because switching the current on and off requires a high amount of energy.

SUMMARY OF THE INVENTION

The present invention provides an over-current protection circuit, an integrated circuit, an apparatus and a computer program product as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

DETAILED DESCRIPTION OF THE PREFERRED EMBODIMENTS

Figure 1:
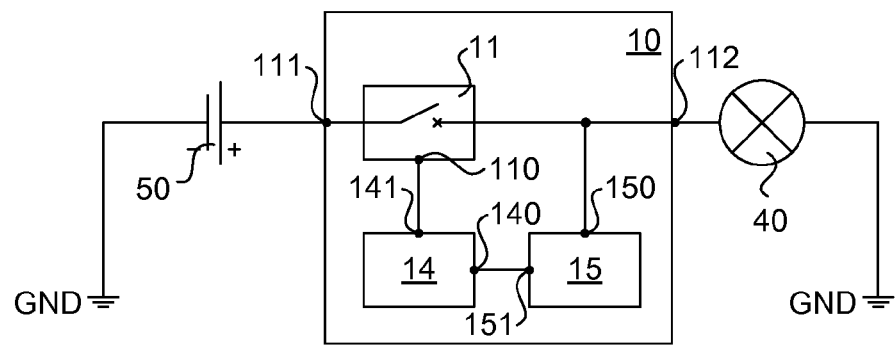
FIG. 1 schematically shows a first example of an embodiment of an over current protection circuit.

Referring to the example of FIG. 1, an over-current protection circuit 10 is shown. The over-current protection circuit 10 may protect a load 40 against over-currents. The load 40 may be any suitable kind of load, such as ground, a light, an actuator or other power consuming device. As shown in FIG. 1 the over-current protection circuit 10 may be connected to the load and be able to interrupt or "break" the current. As shown in FIG. 1, the over-current protection circuit 10 may for example be connected to a current path towards or from the load 40 in such a way that the current can be interrupted. For instance, the over-current protection circuit 10 may connect the load 40 to a power supply 50 or connect the load to ground GND. Although, for sake of simplicity, not shown in FIG. 1, it will be apparent that other components may be present between the power supply 50 and the load 40 and between the load 40 and ground GND.

As shown in FIG. 1, the over-current protection circuit 10 may include a current input 111 and a current output 112. In operation, an input current may be received at the current input 111. At the current output 112 an output current proportional to the input current may be outputted. The output current may for example be substantially the same as the input current, that is be directly proportional to the input current with a proportionality constant of 1. However, depending on the circuitry between the current input 111 and the current output 112, the output current may be exponentially or logarithmic proportional to the input current or exhibit any other suitable dependency on the input current.

The current output 112 may be electrically connected to the load 40 and provide, when connected to the load 40, a current to the load 40. Alternatively, the current input 111 may be connected to the load 40 and receive, when connected to the load 40, a current from the load 40.

As shown in FIG. 1, the over-current protection circuit 10 may include a switch 11. The switch 11 may connect the current input 111 to the current output 112. The switch 11 may have at least two states. The switch 11 is shown in FIG. 1 in an open state in which the switch 11 inhibits the current flow from the current input 111 to the current output 112.

Thus, in the open state the current flow from the current input 111 to the current output 112 is interrupted. In a closed state, the switch 10 may allow a current flow from the current input 111 to the current output 112. Thus, the current flow is enabled in the close state.

The switch 11 may include a switch control input 110 via which the switch state may be controlled. For example, the switch 11 may be in the open state when a switch open signal is applied at the switch control input 110 and be in the closed state when a switch closed signal is applied.

The over-current protection circuit 10 may include a sensor 15 for sensing a load current $I_{load}$ applied to the load 40. As illustrated in FIG. 1, the sensor 15 may for example be connected with a sensor input 150 to a node between the current output 112 and the load 40. However, the sensor input 150 may alternatively be connected to a node between the load 40 and ground or any other point suitable to sense the load current $I_{load}$. It will be apparent that the sensor 15 may sense the actual load current $I_{load}$ itself or sense another parameter which forms a measure for the load current (e.g. the voltage drop over a resistive element through which the load current flows). The sensor 15 may for example be a shunt resistor or a sense FET or other suitable type of current sensor.

The over-current protection circuit 10 may include a controller 14 which is connected to the sensor 15. As shown in FIG. 1, the controller 14 may be connected with a controller input 140 to a sensor output 151 of the sensor 15. The sensor 15 may output a signal representing the sensed load current $I_{load}$ at the sensor output 151, and hence present the signal to the controller input 140. The controller 14 may be connected with a controller output 141 to the control input 110 of the switch, in order to present a control signal corresponding to the desired state of the switch 11 at the control input 110.

The controller 14 may control the switch 11 to be in the open state when the sensed load current has exceeded a current threshold during a predetermined period of time, the predetermined period of time being dependent on an amount of the sensed load current. Thus, the over-current protection circuit 10 may enable and break the current to the load 40 in a manner that accurately resembles the behavior of a conventional fuse. Furthermore, an effective over-current protection can be obtained while the need to pulse the current on and off in a period of pulsed operation is obviated. Accordingly, the power consumption may be reduced and distortion of the current flow may be reduced as well.

Figure 2:
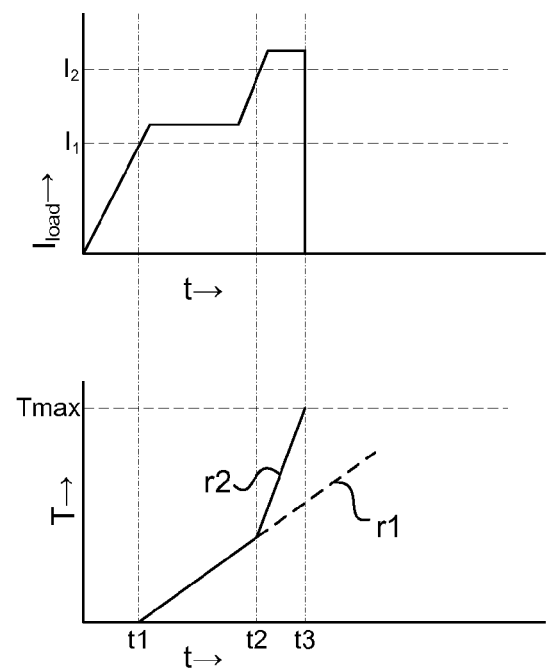
FIG. 2 shows a graph which illustrates the behavior of an example of an embodiment of an over current protection circuit.

Referring to FIG. 2, the over-current protection circuit 10 may perform a method of operating a load. Such a method may include sensing a current applied to a load and controlling the current applied to the load. The controlling may include interrupting the current when the sensed load current has exceeded a current threshold during a predetermined period of time, which predetermined period of time is dependent on an amount with which the sensed load current exceeds the threshold. In FIG. 2, the upper graph represents the load current $I_{load}$ as a function of time t and the lower graph represents a timer value T as a function of the real time t.

As illustrated in FIG. 2, for when the load current $I_{load}$ is below a current threshold $I_1$, e.g. between time t=0 and time t1 in FIG. 2, the current $I_{load}$ may be enabled. The current may be interrupted when the period of time the load current $I_{load}$ is above the current threshold $I_1$ has exceeded a predetermined period of time dependent which is dependent on an amount with which the sensed load current exceeds the threshold $I_1$, e.g. at time t3 in FIG. 2.

The predetermined period of time may be dependent on said amount in any manner suitable for the specific implementation. The predetermined period of time may for example be inversely proportional to the amount with which the sensed load current exceeds a threshold. The predetermined period of time may for example be linearly proportional to the inverse of the amount with which the sensed load current exceeds a threshold. However, depending on the specific implementation, the predetermined period of time may be exponentially or logarithmic proportional or exhibit any other suitable dependency on the amount with which the sensed load current exceeds a threshold. For example, the time-current characteristic may be arc shaped and for example be fitted to follow a measured time-current characteristic of a conventional fuse The timing of switching the load current on and off may be controlled in any manner suitable for the specific implementation. As illustrated in FIG. 2, for example, the period of time the load current $I_{load}$ may be is above the current threshold $I_1$ may be determined by starting a timer when the load current $I_{load}$ exceeds a lowest current threshold $I_1$ and comparing the timer value T with a timer maximum or timer threshold Tmax.

The predetermined period of time may be made dependent on the amount with which the load current exceeds the current threshold in any manner suitable for the specific implementation. For example, two or more thresholds I1-I3 may be used and the predetermined period of time may then be set to be dependent on the specific threshold that is exceeded. The thresholds I1-I3 and the predetermined periods of time may for example be selected such that the coordinates (predetermined period of time; threshold) correspond to points of the breakdown time of a conventional fuse as a function of current, as illustrated in more detail in FIG. 5.

For example, the predetermined period of time may then be set to be dependent on the amount with which the load current exceeds the current threshold by changing the rate of the timer. For instance, when the load current $I_{load}$ exceeds a lowest threshold $I_1$ the timer may start with a certain rate (indicated with dashed line r1 in FIG. 2), as shown at time t1 and when the timer value T exceeds the timer maximum Tmax, the current to the load may be broken, as shown at time t3. The rate may increase when the load current $I_{load}$ increases. The load current $I_{load}$ may for instance be compared with two or more current thresholds $I_1, I_2$ and the predetermined period of time may for example depend on which current thresholds are exceeded. As shown in FIG. 2 at time t2, for example when the load current $I_{load}$ exceeds a second threshold $I_2$ which is higher than the lowest threshold $I_1$, the rate may be increased (indicated with line r2 in FIG. 2). Thus, the timer is accelerated and the period of time it takes until the timer has a timer value T which corresponds to the maximum Tmax is shortened when the load current increases. When the load current comes below the second threshold $I_2$ again, the rate of the timer may then be set back to the earlier rate r1.

The predetermined period of time may also be made dependent on the amount with which the load current exceeds the current threshold by changing the timer maximum Tmax. For example, the predetermined period of time may be reduced by lowering the maximum Tmax when the load current $I_{load}$ increases, e.g. by setting the maximum T max to a first value when the lowest threshold $I_1$ is exceeded, setting the maximum Tmax to a second value lower than the first value when a higher threshold $I_2$, higher than the lowest threshold $I_1$, is exceeded.

The controller 14 may be implemented in any manner suitable for the specific implementation. The over-current protection circuit 10 may include a time controller connected with an input to the sensor 15. The time controller may be arranged to control the predetermined period of time based on the sensed load current $I_{load}$ and/or the current threshold(s) I1-I3.

Figure 3:
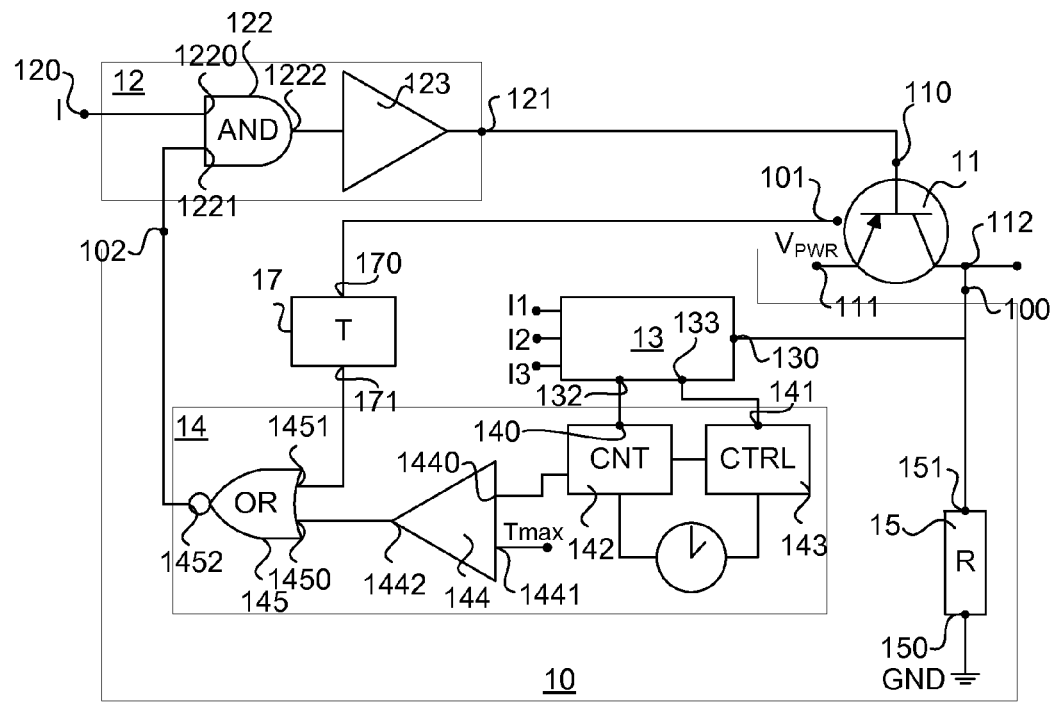
FIG. 3 schematically shows a second example of an embodiment of an over current protection circuit.

Referring to the example of an over-current protection circuit 10 shown in FIG. 3 for instance, the controller 14 may include a current comparator 13, a timer 142 and a time comparator 144.

The current comparator 13 may be connected to the sensor 15. The current comparator 13 may compare the sensed load current $I_{load}$ with one or more current thresholds I1-I3. In this example multiple thresholds I1-I3 are used, with I1<I2<I3. As shown in FIG. 3, the current comparator 13 may be connected with an input 130 to the sensor 15. The current comparator 13 may output a timer start signal at a timer control output 132 of the comparator 13.

The timer 142 may measure a period of time T the sensed load current $I_{load}$ exceeds one or more of the current thresholds I1-I3. The timer 142 may be connected to the current comparator 13, which may for example output a timer start signal when the lowest current threshold I1 is exceeded. For example, a control input 140 of the timer 142 may be connected to the timer control output 132.

The timer 142 may start measuring a period of time in response the timer start signal. The timer 142 may for example be implemented as a counter (CNT), such as an up-counter or a down-counter which increments or decrements a counter value for each number of clock cycles of a clock signal after receiving the timer start signal. As shown, the clock signal may be provided by a clock 145 which connected with a clock output to a clock input of the timer 142.

The controller 14 may include a time controller 143. As illustrated in FIG. 3, the timer controller 143 may be connected to the timer 142. In the example of FIG. 3, the timer controller 143 is connected to a control input of the timer 142. The timer controller 143 may start the timer 142 when the sensed load current Iload exceeds the lowest current threshold and stop the timer 142 when the sensed load current Iload comes, after exceeding the current threshold, below the lowest current threshold, by outputting a start signal and a stop signal respectively.

The timer controller 143 may set a timer value to a predetermined value a predetermined period of time after the sensed load current has come below the lowest current threshold. For instance, the timer controller 143 may be arranged to keep the timer value at the same value as at the point in time the current came, after exceeding the current threshold, below the current threshold and to reset the timer value to an initial value after this period of time has expired.

The timer controller 143 may for example control the timer 143 by performing an operation as can be described by the pseudo-code:

```
WHILE Timer<=Tmax
{
    WHILE (l_load>l(lowest)
    {
        Run(Timer)
    }
    IF l_load<l(lowest);
    THEN
    {
        Stop(Timer);
        Start(TimeOutTimer);
        WHILE (TimeOutTimer<TimeOut);
        {
            RunTimeOutTimer;
```

```
            IF l_load>l(lowest);
            THEN
            {
                Restart(Timer);
                Stop(TimeOutTimer);
                Reset(TimeOutTimer);
            }
        }
        IF TimeOutTimer>TimeOut;
            THEN Reset(Timer);
    }
}
```

The timer controller 143 may adjust the point in time the switch open signal is outputted such that the period of time is dependent on the amount with which the load current $I_{load}$ exceeds the current threshold. As mentioned above, the timer 140 may have for example have an adjustable rate and the time controller 143 may control the rate of the timer 142. The timer controller 143 may for instance control the rate of the timer 142, based on the information from the current comparator 13. Thereby, the period of time it takes before the timer value 142 reaches the threshold Tmax can be controlled based on the sensed load current and the current threshold I1 and hence the predetermined period of time be dependent on the amount with which sensed load current exceeds the lowest current threshold I1.

In the example of FIG. 3, for instance, the timer controller 143 is connected to the clock 145. The timer controller 143 may control the clock frequency of the clock 145 and thereby control the rate of the timer 142. The clock 145 is in turn connected to the timer 142, and more in particular to a clock input of the timer 142. (Thus, the timer controller 143 is indirectly connected to the timer 142. However, the timer controller 143 may be directly connected to the timer 142, for instance in case the timer 142 does not operate on a clock signal provided by a separate clock 145.)

The time controller 143 may for instance receive information about the amount with which the load current $I_{load}$ exceeds the lowest current threshold I1. As shown in FIG. 3, the current comparator 13 may have a second output 133 which is connected to an input 141 of the controller 14, to which input 141 the timer controller 143 is connected with its input. The current comparator 13 may for instance output to the timer controller 143 information about which specific current threshold I1-I3 is exceeded, and hence receive information about the amount with which the load current $I_{load}$ exceeds the lowest current threshold. The time controller 143 may shorten the predetermined period when the amount with which the load current $I_{load}$ exceeds the lowest current threshold I1 increases, for example when the load current exceeds a higher threshold I2,I3.

For instance in the example of FIG. 3, the timer controller 143 may control the clock frequency of the clock 145 and thereby control the counting rate of a counter in the timer 142. The timer controller 143 may for example increase the clock frequency fclock, and hence the rate of the timer, when the load current $I_{load}$ starts exceeding a higher current threshold. The timer controller 143 may for example perform an operation as can be described by the pseudo-code:

```
k=1
WHILE (k<=N)
{
    IF (l_load>l(k)
```

-continued

```
        THEN
        {
            ClockRate= Rate(k);
            k++;
        }
        ELSE ClockRate =Rate(k−1)
}
```

In this example of pseudo-code, the rates Rate(1)-Rate(N) may for example be such that Rate(1)<Rate(2)< . . . <Rate (N−1)<Rate(N).

However, the timer controller 143 may control the predetermined period of time in another manner. For example, the timer controller 143 may control the rate of the timer 142 by setting the number of clock cycles required to increment or decrement a counter value (e.g. when the timer 142 includes a counter which is incremented or decremented with a value x every p number of clock cycles, the timer controller 143 may change the integer value p), changing the value with which the counter value increments or decrements (e.g. changing the value x). Also the timer controller 143 may control the timer maximum Tmax and for example reduce the value Tmax when the amount of load current $I_{load}$ exceeding the lowest threshold $I_1$ augments.

The time comparator 144 may compare the period of time measured by the timer 142, e.g. the counter value of the counter CNT, with a time threshold Tmax and output a switch open signal when the measured period of time exceeds the time threshold Tmax. As shown, the timer comparator 144 may be connected with a first comparator input 1440 to an output of the timer 142 at which the timer 142 outputs a signal representing the period of time measured by the timer 142. At a second comparator input 1441 the time threshold Tmax may be presented. The timer comparator 144 may have a comparator output 1442 at which a switch open signal may be presented by the comparator 144 when the period of time measured by the timer 142 is above (or comes above) the time threshold Tmax. At the comparator output 1442 a switch close signal may be presented by the comparator 144 when the period of time measured by the timer 142 is below (or comes below) the time threshold Tmax.

As illustrated in FIG. 3, the over-current protection circuit 10 may include a temperature sensor 17 for sensing a temperature of the switch 11 or of an environment of the switch 11. The controller 14 may then be connected to the temperature sensor 17 to control the switch state based on a sensed temperature. In the example of FIG. 3, for instance, the temperature sensor 17 is connected with a sensor input 170 to a sensing contact 101 of the switch 11. The temperature sensor 17 may have a sensor output 171 at which an over-temperature signal can be outputted The temperature sensor 17 may output the over-temperature signal when the sensed temperature exceeds a maximum. As shown, the sensor output 171 may, for instance be connected to an input 161 of an NOR port 16 which is connected with another input 160 to the output 1442 of the comparator 144. The NOR port 16 outputs a switch open signal when the temperature sensor 17 outputs the over-temperature signal and/or when the comparator 144 outputs its switch open signal. The NOR port 16 outputs a switch closed signal when neither the temperature sensor 17 outputs the over-temperature signal nor the comparator 144 outputs its switch open signal. As shown, the output 162 of the NOR port 16 is connected to an output 102 of the over-current protection circuit 10.

Figure 6:
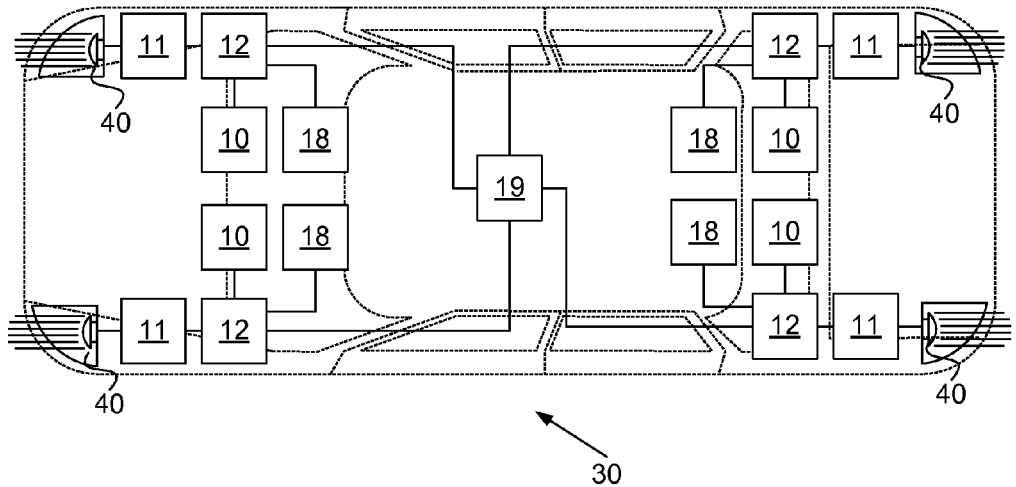
FIG. 6 schematically shows a second example of an embodiment of an apparatus.
Figure 4:
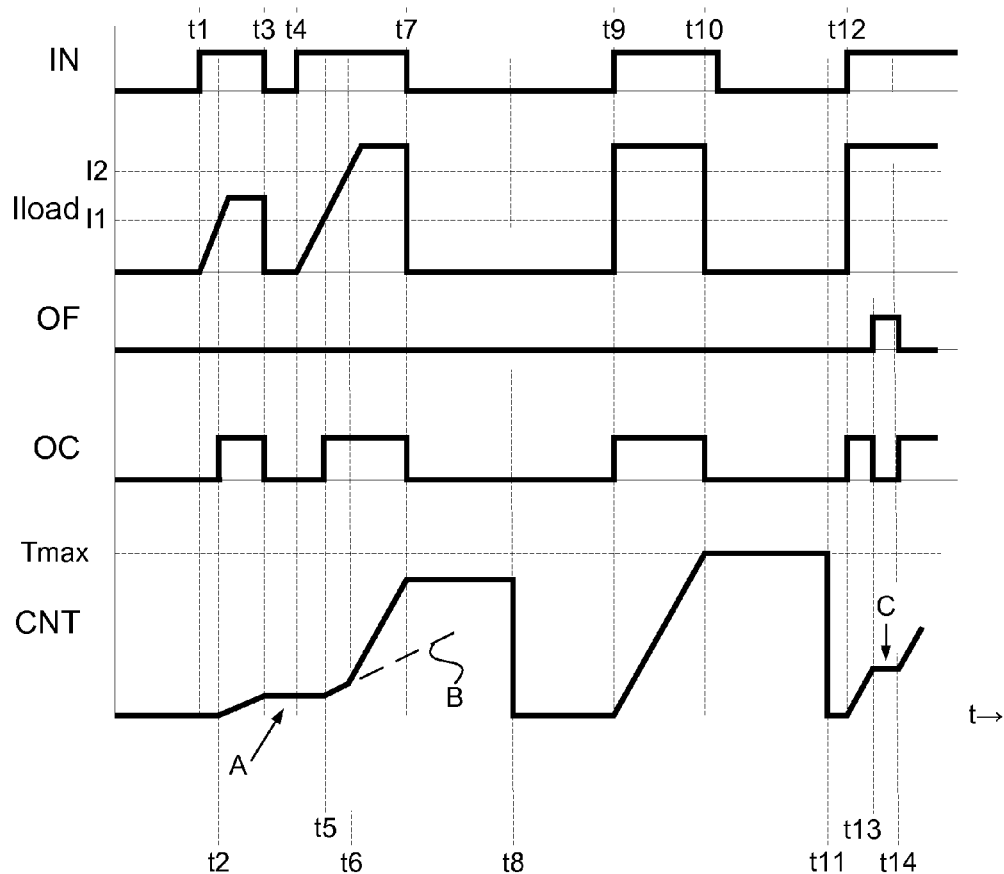
FIG. 4 shows a graph which illustrates the behavior of the second example.

Referring to the timing diagram of FIG. 4, a load controller 18 (as shown in FIG. 6) may output a current 'ON' signal to the switch 11 in order to enable the current to the load 40 and hence activate the load (e.g. to switch a light on or to start a device), as indicated with the signal IN between times t1-t3; t4-t7; t9-t10 and t12 respectively. In response to the current 'ON' signal, the switch 11 may be in the closed state and provide a current $I_{load}$ to the load. As shown at time t2 in FIG. 4, at a certain point in time the load current $I_{load}$ exceeds a lowest threshold I1 and a timer starts counting (as illustrated in FIG. 4 with the timing CNT) in response to an over-current (OC) signal. At time t3, the load current $I_{load}$ drops below the lowest threshold and the timer is stopped. However, the value of the timer may remain the same, thereby creating a memory effect. If the load current $I_{load}$ exceeds the lowest threshold I1 again before expiry of a reset time, the timer is started again, starting with the same value as at time t3. When the period the load current is below the lowest threshold exceeds the reset time, the timer is reset to an initial value (e.g. zero), as illustrated at time t8 in FIG. 4.

When the amount with which the load current $I_{load}$ exceeds the lowest threshold t1 increases, the timer may be accelerated, as illustrated with the dashed line B. The acceleration may for example be a continuous function of the load current $I_{load}$. However, as shown in FIG. 4, the acceleration may also be a step function of the load current $I_{load}$, and the timer may be accelerated when the load current $I_{load}$ exceeds a second threshold I2, which is higher than the lowest threshold I1 (and be accelerated further when the load current $I_{load}$ exceeds a third threshold I3, which is higher than the second threshold I2, etc.). As shown at time t7, when the load controller 18 does not assert that the load has to be provided with a current anymore, the load current is stopped e.g. because the switch 11 is put into the open state. The load current thus drops below the lowest threshold t1 and the timer is stopped. When the reset period has expired, the timer is reset as indicated at time t8 in FIG. 4. As illustrated at time t13, when the temperature exceeds a maximum, an over-temperature signal (OF) is asserted, in response to which the timer is stopped but not reset, as indicated with arrow C in FIG. 4. When the temperature drops below the maximum, the over-temperature signal is deserted and, when the over-current signal is still asserted, the timer is restarted, as indicated at time t4 in FIG. 4.

Referring back to FIG. 3, as shown, the over-current protection circuit 10 may be connected with an output 102 to an input of a switch controller 12. The switch controller 12 may for example control the state of the switch based on a load on/off signal and the output of the over-current protection circuit 10. In the example of FIG. 3, for instance, the switch controller 12 includes an AND port 122 which is connected with a first input 1220 to a contact 120 at which a load control signal can be provided. The output 102 of the over-current protection circuit 10 is connected to a second input 1221 of the AND port 122. The output 1222 of the AND port 122 is connected to a push-pull driver 123 which connects the output 1222 to an output 121 of the switch controller 12. The output 121 is connected to a control input of the switch 11

Figure 5:
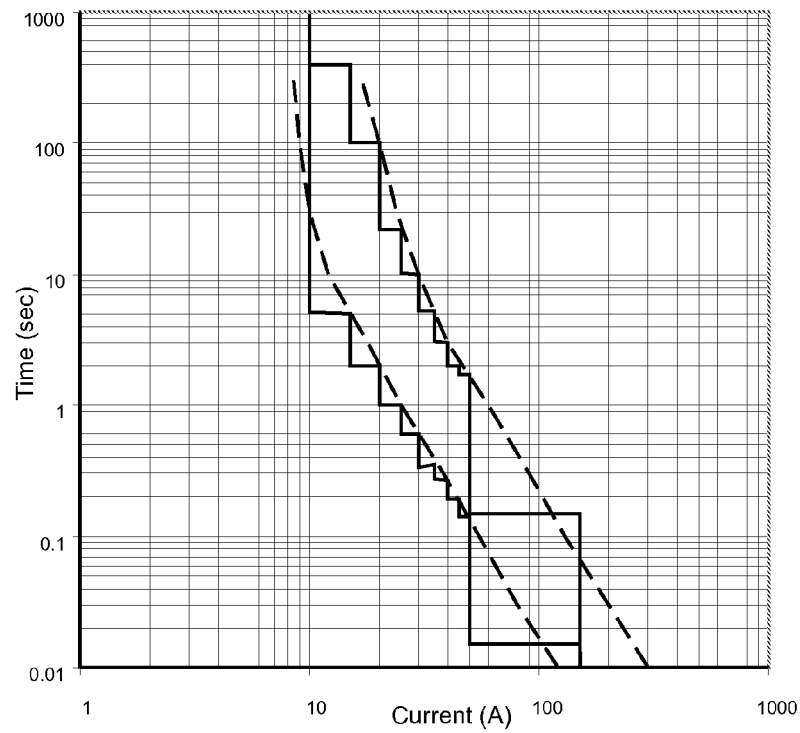
FIG. 5 shows a graph which shows the simulated time before circuit breaking as a function of the load current.

FIG. 5 shows a graph of simulated results for an over-current protection circuit operating as illustrate in FIG. 4 compared to a mechanical fuse, for different current thresholds and without taking into account the temperature. The predetermined period of time for the breaking of the over-current protection circuit is set in the example of FIG. 5 as a function which decreases stepwise. As show, the over-current protection circuit accurately mimics the behavior of a mechanical fuse. It will be appreciated that the granularity of the step-function may be varied, e.g. reduced to more closely mimic the breaking curve of a conventional fuse or increase to reduce the amount of processing required.

Referring to FIG. 6, an example of an apparatus 30 including an over-current protection circuit is shown. In this example, the apparatus 30 is a car. As shown, one or more loads 40 are connected to a power supply 19, e.g. a battery. In the shown example the loads 40 are lights of the car, however it will be apparent that the load 40 may be other types of components of an apparatus, such as a radio, a windshield wiper, an air conditioning system or other components As shown, the loads 40 are connected to the supply 19 via respective switches 11 which in turn are connected to over-current protection circuits 10 and to load controllers 18. The configuration of the switches 11, the circuits 10 and the load controllers 18 may for example operate as explained above with reference to FIGS. 3 and 4, and for sake of brevity is not explained in further detail The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be an type of connection suitable to transfer signals from or to the respective nodes, units or devices, for example via intermediate devices. Accordingly, unless implied or stated otherwise the connections may for example be direct connections or indirect connections.

Also, for example, the over-current protection circuit may be provided as a part of an integrated circuit and for example be provided on the same die as the load 40 or be provided on a separate die but in the same integrated circuit package. Also, the switch 11 may be any suitable kind of switch and for example be implemented as a semiconductor switch, as shown in FIG. 3 in which the switch is implemented as a bipolar transistor, in this example a PNP bipolar. However the switch may be implemented as a different type of semiconductor switch, such as an NPN bipolar or as a Field Effect Transistor (FET) or a bu. Thereby, the over-current circuit 10 can be implemented as an integrated circuit, and for example be provided on a single die.

Also, the invention is not limited to physical devices or units implemented in non-programmable hardware but can also be applied in programmable devices or units able to perform the desired device functions by operating in accordance with suitable program code. For example, a microcontroller or other microprocessor may be programmed to operate as an over-current protection circuit. Furthermore, the devices may be physically distributed over a number of apparatuses, while functionally operating as a single device. For instance, the controller 14 may be implemented as a number of discrete components connected in such a way that they form together a controller 14.

Also, devices functionally forming separate devices may be integrated in a single physical device. For example, the over-current circuit 10 can be implemented as an integrated circuit, and for example be provided on a single die.

Also, the opening time-current characteristic of the over-current protection circuit may be fitted onto another type of physical event than the opening time-current characteristic of a conventional fuse.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

The invention claimed is:

1. An over-current protection circuit, comprising:
   a current input for receiving a input current;
   a current output electrically connectable to a load, for outputting an output current proportional to the input current;
   a switch connecting the current input to the current output, said switch having at least two switch states, said switch states including an open state in which a current flow from the current input to the current output is interrupted and a closed state in which said current flow is enabled, said switch including a switch control input for controlling the switch state;
   a sensor for sensing a load current applied to said load;
   a controller connected to the sensor for controlling said switch to be in said open state when said sensed load current has exceeded a current threshold during a predetermined period of time, said predetermined period of time being dependent on an amount with which said sensed load current exceeds the threshold, said controller including:
      a current comparator connected to said sensor, for comparing the sensed load current with a current threshold;
      a timer connected to said current comparator, for measuring a period of time the sensed load current exceeds said current threshold; and
      a time comparator connected to said timer, for comparing the measured period of time with a timer threshold and outputting a switch open signal when said measured period of time exceeds said timer threshold; and
      a time controller for controlling said timer or said timer threshold such that the period of time is shorted when an amount of sensed load current increases and the period of time is increased when said amount of sensed load current decreases, said time controller being connected to said current comparator for receiving information about said amount of sensed load current.

2. An over-current protection circuit as claimed in claim 1, wherein said predetermined period of time is inversely proportional to the amount.

3. An over-current protection circuit as claimed in claim 2, wherein the time-current characteristic of said period of time as a function of said amount of sensed load current is arc-shaped.

4. An over-current protection circuit as claimed in claim 2, wherein said controller includes a timer with an adjustable rate, and said timer controller controls the rate to be proportional to said amount of sensed load current with which of said load current exceeds said current threshold.

5. An over-current protection circuit as claimed in claim 2, wherein said timer controller is arranged to:
   start the timer when the sensed load current exceeds the current threshold
   stop the timer when the sensed load current comes, after exceeding the current threshold, below the current threshold and
   set a timer value to a predetermined value a predetermined period of time after the sensed load current has come below the current threshold.

6. An over-current protection circuit as claimed in claim 2, including:
   a temperature sensor for sensing a temperature of said switch or an environment of said switch, and wherein said controller is connected to said temperature sensor to control said switch state based on a sensed temperature.

7. An over-current protection circuit as claimed in claim 1, wherein the time-current characteristic of said period of time as a function of said amount of sensed load current is arc-shaped.

8. An over-current protection circuit as claimed in claim 7, wherein said controller includes a timer with an adjustable rate, and said timer controller controls the rate to be proportional to said amount of sensed load current with which of said load current exceeds said current threshold.

9. An over-current protection circuit as claimed in claim 7, wherein said timer controller is arranged to:
   start the timer when the sensed load current exceeds the current threshold
   stop the timer when the sensed load current comes, after exceeding the current threshold, below the current threshold and
   set a timer value to a predetermined value a predetermined period of time after the sensed load current has come below the current threshold.

10. An over-current protection circuit as claimed in claim 7, including:
    a temperature sensor for sensing a temperature of said switch or an environment of said switch, and wherein said controller is connected to said temperature sensor to control said switch state based on a sensed temperature.

11. An over-current protection circuit as claimed in claim 1, wherein said controller includes a timer with an adjustable rate, and said timer controller controls the rate to be proportional to said amount of sensed load current with which of said load current exceeds said current threshold.

12. An over-current protection circuit as claimed in claim 11, wherein said timer controller is arranged to:
    start the timer when the sensed load current exceeds the current threshold
    stop the timer when the sensed load current comes, after exceeding the current threshold, below the current threshold and
    set a timer value to a predetermined value a predetermined period of time after the sensed load current has come below the current threshold.

13. An over-current protection circuit as claimed in claim 1, wherein said timer controller is arranged to:
    start the timer when the sensed load current exceeds the current threshold
    stop the timer when the sensed load current comes, after exceeding the current threshold, below the current threshold and
    set a timer value to a predetermined value a predetermined period of time after the sensed load current has come below the current threshold.

14. An over-current protection circuit as claimed in claim 13, wherein said timer controller is arranged:
    to keep the timer value at the same value as at the point in time the current came, after exceeding the current threshold, below the current threshold; and
    to reset the timer value to an initial value after said predetermined period of time.

15. An over-current protection circuit as claimed in claim 13, wherein said timer controller is arranged to decrease the timer value as a function of the period of time the sensed load current has been, after exceeding the current threshold, below the current threshold.

16. An over-current protection circuit as claimed in claim 1, including:
    a temperature sensor for sensing a temperature of said switch or an environment of said switch, and wherein said controller is connected to said temperature sensor to control said switch state based on a sensed temperature.

17. An over-current protection circuit as claimed in claim 1, wherein the switch is a semiconductor switch.

18. An integrated circuit including an over-current protection circuit as claimed in claim 1.

19. An apparatus including an over-current protection circuit as claimed in claim 1.

20. A method of operating a load, comprising:
    sensing a current applied to a load;
    controlling said current applied to said load, including:
      comparing the sensed load current with a current threshold;
      measuring a period of time the sensed load current exceeds said current threshold;
      comparing the measured period of time with a timer threshold (Tmax) and interrupting said current when said measured period of time exceeds said timer threshold; and
      controlling said timer or said timer threshold such that the period of time is shorted when an amount of sensed load current increases and the period of time is increased when said amount of sensed load current decreases.

* * * * *